United States Patent
Fukushima

(10) Patent No.: US 12,054,828 B2
(45) Date of Patent: *Aug. 6, 2024

(54) SUBSTRATE PROCESSING METHOD AND SUBSTRATE PROCESSING APPARATUS

(71) Applicant: TOKYO ELECTRON LIMITED, Tokyo (JP)

(72) Inventor: Kohei Fukushima, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/082,674

(22) Filed: Dec. 16, 2022

(65) Prior Publication Data

US 2023/0118483 A1 Apr. 20, 2023

Related U.S. Application Data

(63) Continuation of application No. 16/136,689, filed on Sep. 20, 2018, now Pat. No. 11,560,628.

(30) Foreign Application Priority Data

Sep. 22, 2017 (JP) ................................ 2017-182928

(51) Int. Cl.
*C23C 16/52* (2006.01)
*C23C 16/40* (2006.01)
(Continued)

(52) U.S. Cl.
CPC ............ *C23C 16/52* (2013.01); *C23C 16/401* (2013.01); *C23C 16/45527* (2013.01); *C23C 16/45544* (2013.01); *C23C 16/45546* (2013.01); *C23C 16/45578* (2013.01); *C23C 16/4583* (2013.01); *C23C 16/4584* (2013.01); *H01L 21/67017* (2013.01); *H01L 21/67109* (2013.01); *H01L 21/67393* (2013.01); *H01L 21/68771* (2013.01)

(58) Field of Classification Search
None
See application file for complete search history.

(56) References Cited

U.S. PATENT DOCUMENTS

| 4,062,318 A | 12/1977 | Ban et al. |
| 5,388,937 A | 2/1995 | Farsai |
| (Continued) | | |

FOREIGN PATENT DOCUMENTS

| JP | S5825224 B2 | 2/1983 |
| JP | 2011-029441 A | 2/2011 |
| (Continued) | | |

*Primary Examiner* — Mandy C Louie
(74) *Attorney, Agent, or Firm* — Nath, Goldberg & Meyer; Jerald L. Meyer; Tanya E. Harkins

(57) ABSTRACT

A substrate processing method includes supplying processing gas from a plurality of gas holes formed along a longitudinal direction of an injector, which extends in a vertical direction along an inner wall surface of a processing container and is rotatable around a rotational axis extending in the vertical direction, to perform a predetermined process on a substrate accommodated in the processing container. The predetermined process includes a plurality of operations, and a supply direction of the processing gas is changed by rotating the injector in accordance with the operations.

5 Claims, 19 Drawing Sheets

(51) Int. Cl.
    *C23C 16/455*     (2006.01)
    *C23C 16/458*     (2006.01)
    *H01L 21/67*     (2006.01)
    *H01L 21/673*     (2006.01)
    *H01L 21/687*     (2006.01)

(56) References Cited

U.S. PATENT DOCUMENTS

| | | |
|---|---|---|
| 6,352,594 B2 | 3/2002 | Cook et al. |
| 7,900,580 B2 | 3/2011 | Kontani et al. |
| 11,560,628 B2 * | 1/2023 | Fukushima ........ H01L 21/67393 |
| 2007/0137794 A1 | 6/2007 | Qiu et al. |
| 2009/0010761 A1 | 1/2009 | Schiel |
| 2009/0277787 A1 | 11/2009 | Sander et al. |
| 2010/0116209 A1 | 5/2010 | Kato |
| 2011/0186159 A1 | 8/2011 | Chiang et al. |
| 2012/0199067 A1 | 8/2012 | Morozumi et al. |
| 2013/0178070 A1 | 7/2013 | Kim et al. |
| 2013/0327273 A1 * | 12/2013 | Okada ............... H01L 21/67109 |
| | | 118/715 |
| 2014/0134332 A1 | 5/2014 | Sugino |
| 2014/0357058 A1 | 12/2014 | Takagi et al. |

FOREIGN PATENT DOCUMENTS

| | | | | |
|---|---|---|---|---|
| JP | 2011-176081 A | | 9/2011 | |
| JP | 2013-89818 | * | 5/2013 | ........... C23C 16/455 |
| JP | 201389818 B2 | | 5/2013 | |
| JP | 5284182 B2 | | 9/2013 | |
| JP | 2015-018879 A | | 1/2015 | |
| WO | 2005031803 A2 | | 4/2005 | |

\* cited by examiner

FIG. 5A

| | ADSORPTION OPERATION |
|---|---|
| INJECTOR POSITION | (diagram showing injectors 110a–110e and 111a–111e with gas flows N₂, H₂/N₂, Si/N₂, O₂/N₂, N₂ toward wafer W, 10) |
| 110a | $N_2$ |
| 110b | $N_2$ (SMALL AMOUNT) |
| 110c | Si |
| 110d | $N_2$ (SMALL AMOUNT) |
| 110e | $N_2$ |

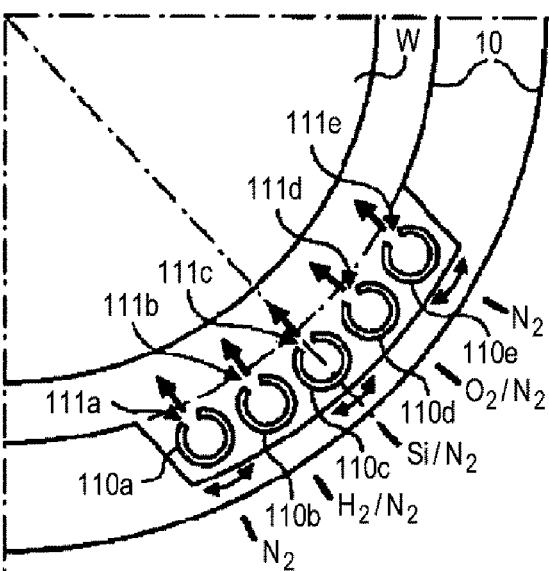

FIG. 5C

| | OXIDATION OPERATION |
|---|---|
| INJECTOR POSITION | (diagram showing wafer W, element 10, injectors 110a–110e and flows 111a–111e, with gases labeled $N_2$, $O_2/N_2$, $Si/N_2$, $H_2/N_2$, $N_2$) |
| 110a | $N_2$ |
| 110b | $H_2$ |
| 110c | $N_2$ (SMALL AMOUNT) |
| 110d | $O_2$ |
| 110e | $N_2$ |

FIG. 6D

| | SECOND PURGE OPERATION |
|---|---|
| INJECTOR POSITION | (diagram showing W, 10, 111h, 110h, 111g, 111f, 110f, 110g, O₂/N₂, Si/N₂, H₂/N₂) |
| 110f | $N_2$ |
| 110g | $N_2$ (SMALL AMOUNT) |
| 110h | $N_2$ |

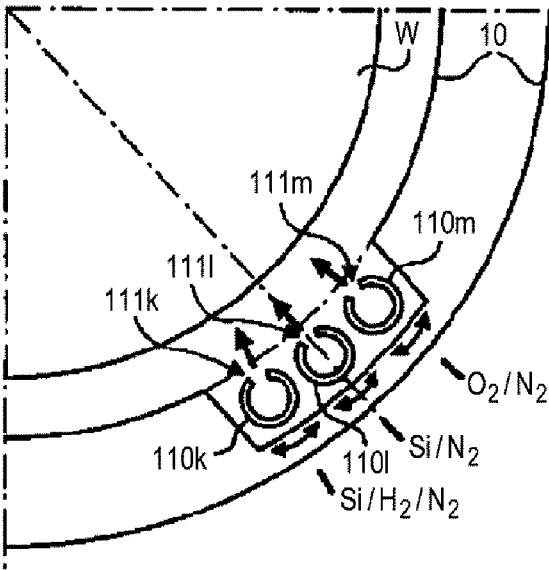

FIG. 7C

| INJECTOR POSITION | OXIDATION OPERATION |
|---|---|
| | (diagram showing W, 10, 111m, 110m, 111l, 111k, 110k, 110l, O₂/N₂, Si/N₂, Si/H₂/N₂) |
| 110K | $H_2$ |
| 110l | $N_2$ (SMALL AMOUNT) |
| 110m | $O_2$ |

SUBSTRATE PROCESSING METHOD AND SUBSTRATE PROCESSING APPARATUS

CROSS-REFERENCE TO RELATED APPLICATION

This is a Continuation Application of U.S. patent application Ser. No. 16/136,689, filed Sep. 20, 2018, an application claiming the benefit from Japanese Application No. 2017-182928, filed Sep. 22, 2017, the contents of each of which are hereby incorporated by reference in their entirety.

TECHNICAL FIELD

The present disclosure relates to a substrate processing method and a substrate processing apparatus.

BACKGROUND

There has been known a batch-type substrate processing apparatus capable of performing a film-forming process on a plurality of substrates in the state in which the plurality of substrates is held in multiple stages in a substrate holder in a processing container.

This batch-type substrate processing apparatus has a structure in which a gas flow passage is formed in the side wall of the processing container and a horizontal portion of an L-shaped injector is inserted into the processing-container side of the gas flow passage, so that the injector is fixed to the processing container. In addition, in a vertical portion of the injector, a plurality of gas ejection portions is provided along the direction (vertical direction) in which the substrates are stacked.

SUMMARY

However, in the above-described substrate processing apparatus, since the injector is fixed to the processing container, there may be the case in which in-plane distribution of characteristics of a film formed on the substrate cannot be sufficiently controlled because the discharge direction of gas is constant.

Therefore, an aspect of the present disclosure is to provide a substrate processing method capable of controlling the in-plane distribution of a process performed on a substrate.

According to one embodiment of the present disclosure, there is provided a substrate processing method including: supplying processing gas from a plurality of gas holes formed along a longitudinal direction of an injector, which extends in a vertical direction along an inner wall surface of a processing container and is rotatable around a rotational axis extending in the vertical direction, to perform a predetermined process on a substrate accommodated in the processing container, wherein the predetermined process includes a plurality of operations, and a supply direction of the processing gas is changed by rotating the injector in accordance with the operations.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A to 5D are views showing a substrate processing method according to a first embodiment;

FIGS. 6A to 6D are views showing a substrate processing method according to a second embodiment;

FIGS. 7A to 7D are views showing a substrate processing method according to a third embodiment;

DETAILED DESCRIPTION

Figure 1:
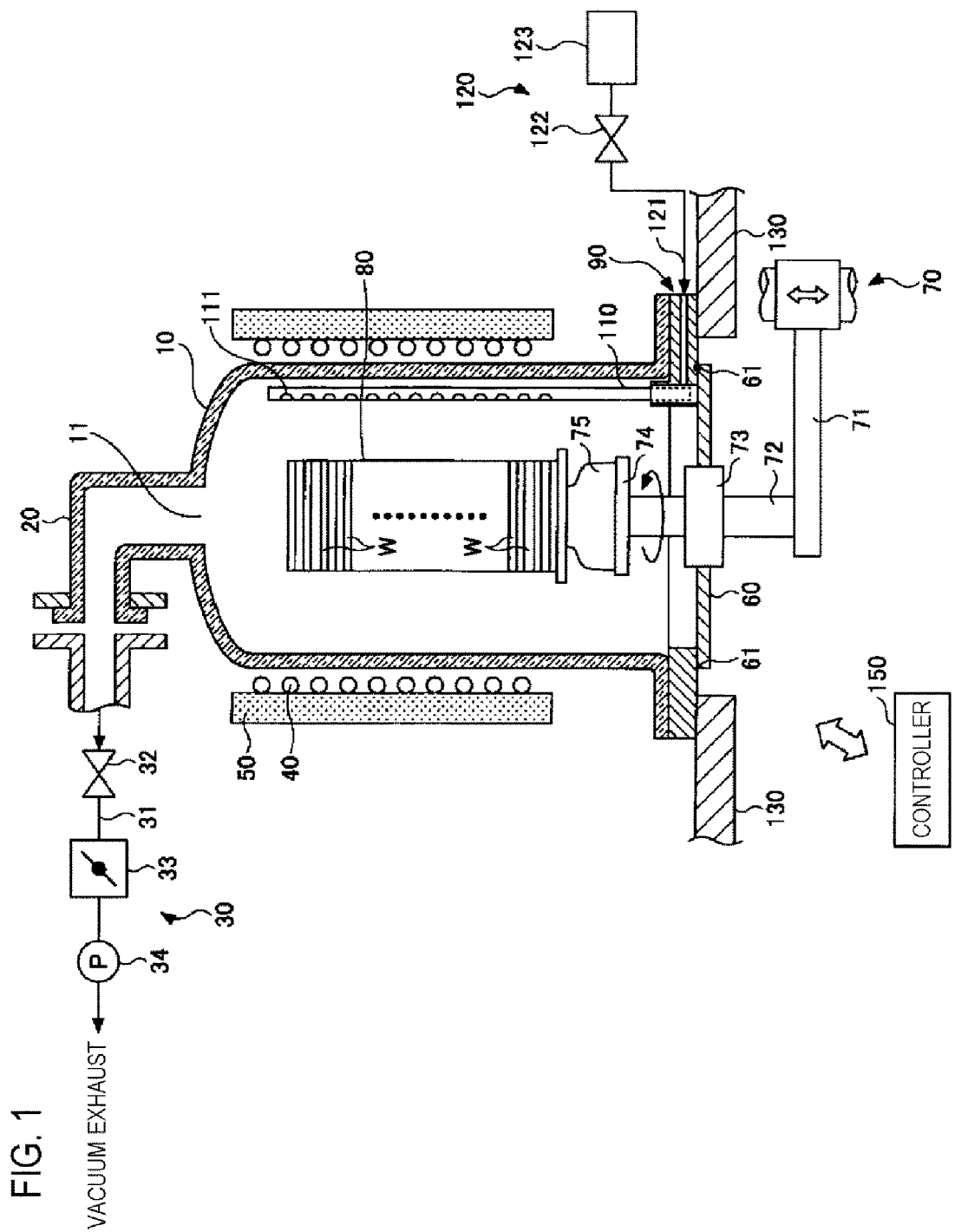
FIG. 1 is a schematic view showing a substrate processing apparatus according to an embodiment of the present disclosure.

Hereinafter, embodiments for carrying out the present disclosure will be described with reference to the drawings. In this specification and the drawings, components that are substantially the same are denoted by the same reference numerals, and redundant description thereof is omitted.

[Substrate Processing Apparatus]

As an example of a substrate processing apparatus according to an embodiment of the present disclosure, an apparatus that performs heat treatment on a substrate will be described. However, the processing target and the processing content are not particularly limited, and can be applied to various processing apparatuses that supply gas to a processing container and perform processing. FIG. 1 is a schematic view showing a substrate processing apparatus according to an embodiment of the present disclosure.

As shown in FIG. 1, the substrate processing apparatus has a processing container 10 capable of accommodating a semiconductor wafer (hereinafter referred to as "wafer W"). The processing container 10 is formed into a substantially cylindrical shape from quartz having high heat resistance, and has an exhaust port 11 in a ceiling thereof. The processing container 10 is formed into a vertical shape extending in a vertical (up-and-down) direction. When, for example, the diameter of the wafer W to be processed is 300 mm, the diameter of the processing container 10 is set in a range of about 350 to 450 mm.

A gas exhaust port 20 is connected to the exhaust port 11 of the ceiling of the processing container 10. The gas exhaust port 20 is constituted of, for example, a quartz tube extending from the exhaust port 11 and bent at a right angle in an L shape.

A vacuum exhaust system 30 for exhausting the atmosphere in the processing container 10 is connected to the gas exhaust port 20. Specifically, the vacuum exhaust system 30 has a gas exhaust pipe 31 made of metal, for example, stainless steel, which is connected to the gas exhaust port 20. An opening/closing valve 32, a pressure adjustment valve 33 such as a butterfly valve, and a vacuum pump 34 are sequentially provided in the middle of the gas exhaust pipe 31, so that the inside of the processing container 10 can be evacuated while the pressure in the processing container 10 is adjusted. In addition, the inner diameter of the gas exhaust port 20 is set to be equal to the inner diameter of the gas exhaust pipe 31.

A heating means 40 is provided on the side portion of the processing container 10 so as to surround the processing container 10 so that the wafer W accommodated in the processing container 10 can be heated. The heating means 40 is divided into, for example, a plurality of zones, and is constituted of a plurality of heaters (not shown) whose heat generation amounts can be independently controlled from the upper side to the lower side in the vertical direction. In addition, the heating means 40 may be constituted of one heater without being divided into a plurality of zones. In addition, a heat-insulating material 50 is provided on the outer periphery of the heating means 40 so as to ensure thermal stability.

A lower end portion of the processing container 10 is open so that the wafer W can be carried in and out. The opening in the lower end portion of the processing container 10 is configured to be opened and closed by a lid body 60.

Above the lid body 60, a wafer boat 80 is provided. The wafer boat 80 is a substrate holder for holding the wafer W, and is configured to be able to hold a plurality of wafers W in the state in which the wafers W are spaced apart from each other in the vertical direction. The number of wafers W held by the wafer boat 80 is not particularly limited, but may be, for example, 50 to 150.

The wafer boat 80 is placed on a table 74 via a heat-insulating cylinder 75 made of quartz. The table 74 is supported by an upper end portion of a rotational shaft 72 passing through the lid body 60 for opening and closing the opening in the lower end portion of the processing container 10. For example, a magnetic fluid seal 73 is interposed in the through portion of the rotational shaft 72, and rotatably supports the rotational shaft 72 in the state in which the rotational shaft 72 is hermetically sealed. In addition, a seal member 61, for example, an O-ring, is interposed in a peripheral portion of the lid body 60 and the lower end portion of the processing container 10, so that sealability in the processing container 10 is maintained.

The rotational shaft 72 is attached to a distal end of an arm 71 supported by a lifting and lowering mechanism 70 such as a boat elevator or the like, and is configured to integrally lift and lower the wafer boat 80, the lid body 60, and the like. In addition, a table 74 may be fixed to the lid body 60 side so as to perform processing of the wafer W without rotating the wafer boat 80.

A manifold 90 having a portion extending along the inner circumferential wall of the processing container 10 and having a flange-like portion extending outwards in a radial direction is disposed at the lower end portion of the processing container 10. Required gas is introduced into the processing container 10 from the lower end portion of the processing container 10 through the manifold 90. The manifold 90 is constituted of a separate component from the processing container 10, but may be provided integrally with the side wall of the processing container 10 to constitute a part of the side wall of the processing container 10. The detailed configuration of the manifold 90 will be described later.

The manifold 90 supports the injector 110. The injector 110 is a tubular member for supplying a gas into the processing container 10, and is made of, for example, quartz. The injector 110 is provided so as to extend in the vertical direction inside the processing container 10. A plurality of gas holes 111 is provided in the injector 110 at predetermined intervals along the longitudinal direction so that gas can be discharged from the gas holes 111 in the horizontal direction. The number of injectors 110 may be one, or may be plural.

Figure 2A:
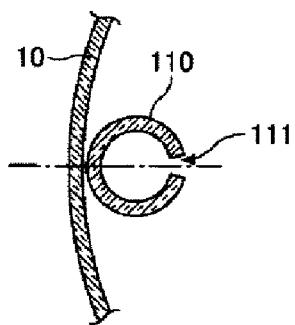
FIGS. 2A to 2C are transverse cross-sectional views showing an injector of the substrate processing apparatus of FIG. 1.
Figure 2B:
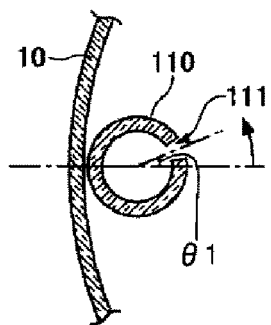
Figure 2C:
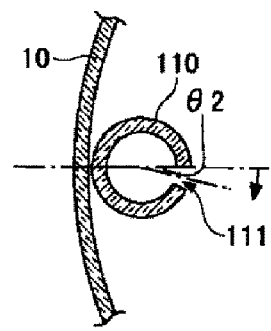

FIGS. 2A to 2C are transverse cross-sectional views showing an injector of the substrate processing apparatus of FIG. 1. In FIGS. 2A to 2C, one injector 110 is shown as an example. FIG. 2A shows the state of the injector 110 at the origin position. FIG. 2B shows the state of the injector 110 at a position rotated by a predetermined angle $\theta1$ counterclockwise from the origin position, and FIG. 2C shows the state of the injector 110 at a position rotated by a predetermined angle $\theta2$ clockwise from the origin position.

The injector 110 is connected to a rotation mechanism which will be described later, and is rotatable counterclockwise and clockwise by the operation of the rotation mechanism. Specifically, the injector 110 may be rotatable counterclockwise from the position where the gas holes 111 face the center of the processing container 10, as shown in FIG. 2A, to the position of the angle $\theta1$, as shown in FIG. 2B. Further, as shown in FIG. 2C, the injector 110 may be rotatable clockwise to the position of the angle $\theta2$. Next, by rotating the injector 110 in the state where the gas is discharged from the gas holes 111 of the injector 110 in the horizontal direction, the in-plane distribution of a process performed on the wafer W can be controlled. The angles $\theta1$ and the angle $\theta2$ are preferably 60 degrees so that the effect of controlling the in-plane distribution of the process performed to the wafer W can be sufficiently exerted, and are preferably 90 degrees when a plurality of kinds of gases is supplied from the injector 110. The rotational speed of the injector 110 is preferably the speed at which the injector 110 is rotatable from zero degrees to the angles $\theta1$ and $\theta2$ in about 3 seconds so as to prevent the generation of particles. For example, when $\theta1$ is 90 degrees, the rotational speed thereof is preferably 5 rpm or less.

Referring again to FIG. 1, a gas supply system 120 is connected to the injector 110 to supply gas to the injector 110. The gas supply system 120 has a gas pipe 121 made of a metal communicating with the injector 110, for example, stainless steel. A flow rate controller 123 such as a mass flow controller and an opening/closing valve 122 are sequentially provided in the middle of the gas pipe 121 to supply processing gas while controlling the flow rate of the processing gas. Another processing gas required for processing the wafer W is also supplied via the gas supply system 120 and the manifold 90, which are similarly configured.

A peripheral portion of the manifold 90 of the lower end portion of the processing container 10 is supported by a base plate 130 made of, for example, stainless steel, and supports the load of the processing container 10 by the base plate 130. The lower side of the base plate 130 is a wafer transfer chamber having a wafer transfer mechanism (not shown), and is in a nitrogen gas atmosphere of substantially atmospheric pressure. In addition, the upper side of the base plate 130 is in an atmosphere of clean air in a clean room.

In addition, as shown in FIG. 1, a controller 150 that controls the entire substrate processing apparatus is provided. The controller 150 controls the operation of various devices inside the substrate processing apparatus so that processing is performed under various processing conditions indicated in a recipe. In addition, the controller 150 receives signals from various sensors provided in the substrate processing apparatus, thereby ascertaining the position of the wafer W and performing sequence control for advancing a corresponding process. Further, the controller 150 ascertains the state of the substrate processing by receiving physical measurement values and the like, detected by various detectors provided in the substrate processing apparatus, and performs feedback control necessary for appropriately performing substrate processing or the like.

The controller 150 includes a calculation means and a storage means such as a Central Processing Unit (CPU), a Read-Only Memory (ROM), a Random Access Memory (RAM), or the like. The controller 150 may be configured as a microcomputer that installs a program for processing a recipe from a storage medium in which the program is stored and executes recipe processing. In addition, the controller 150 may be configured as an electronic circuit such as an Application-Specific Integrated Circuit (ASIC).

[Gas Introduction Mechanism]

Figure 3A:
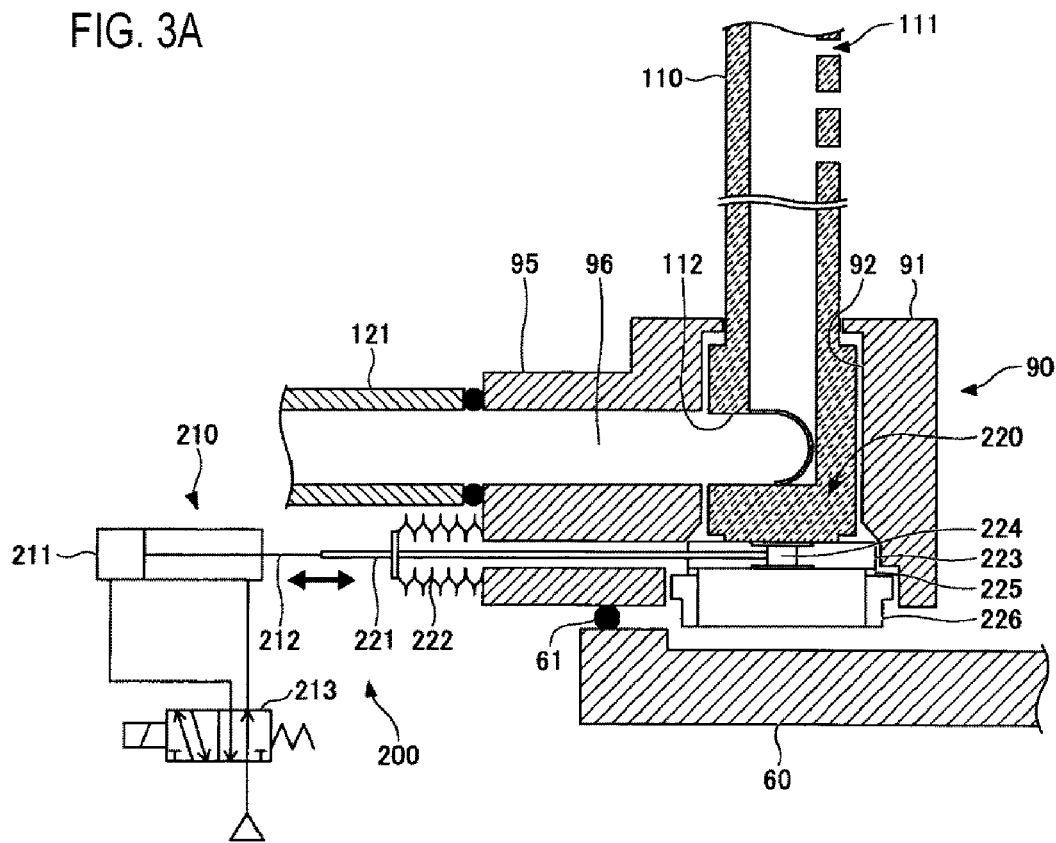
FIGS. 3A and 3B are views showing an example of a gas introduction mechanism of the substrate processing apparatus of FIG. 1.
Figure 3B:
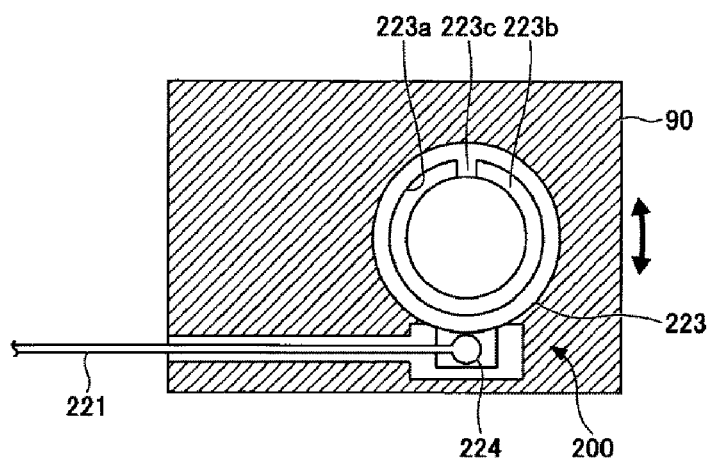
Figure 4:
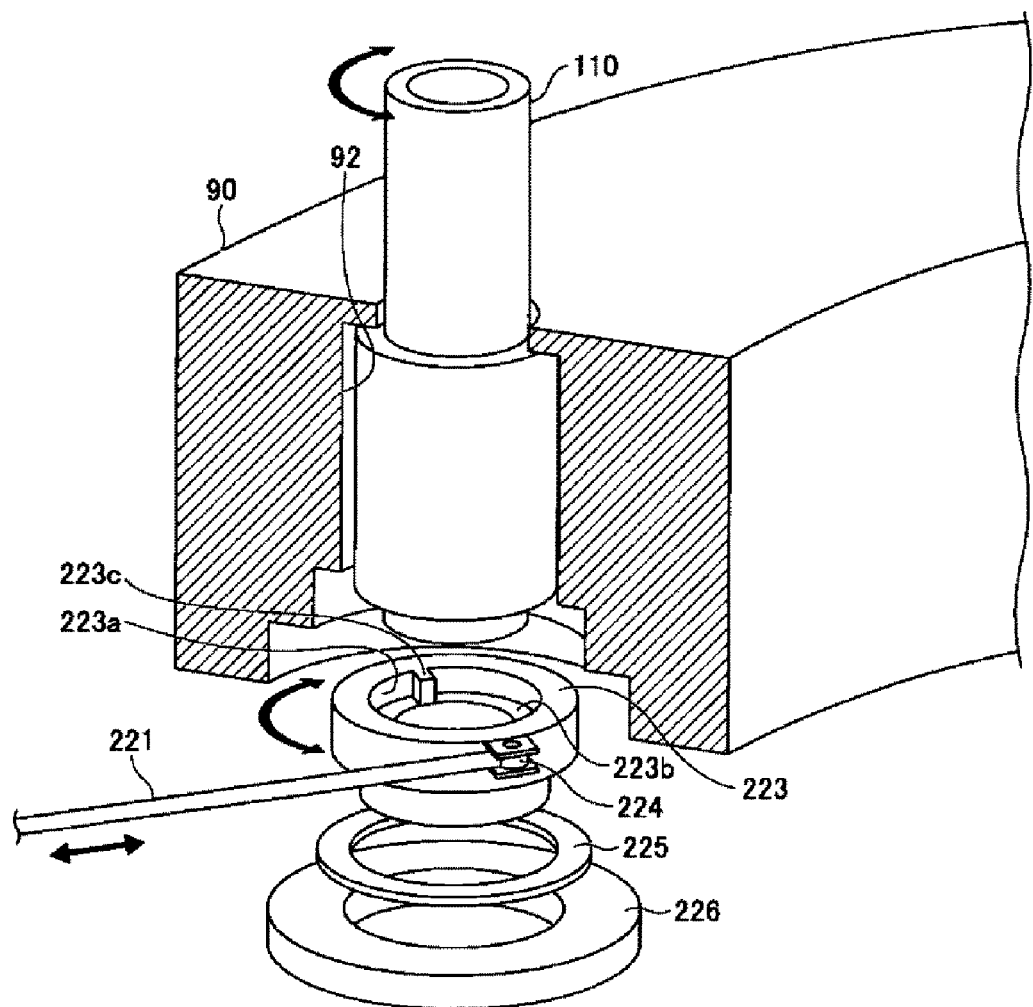
FIG. 4 is an exploded perspective view showing the internal structure of the gas introduction mechanism of FIGS. 3A and 3B.
Figure 5D:
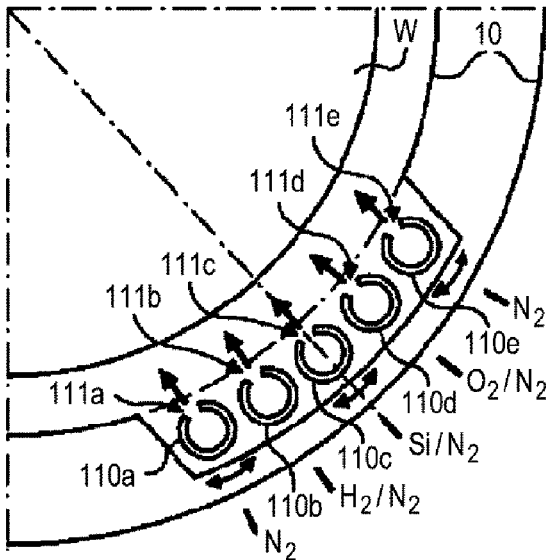
Figure 6A:
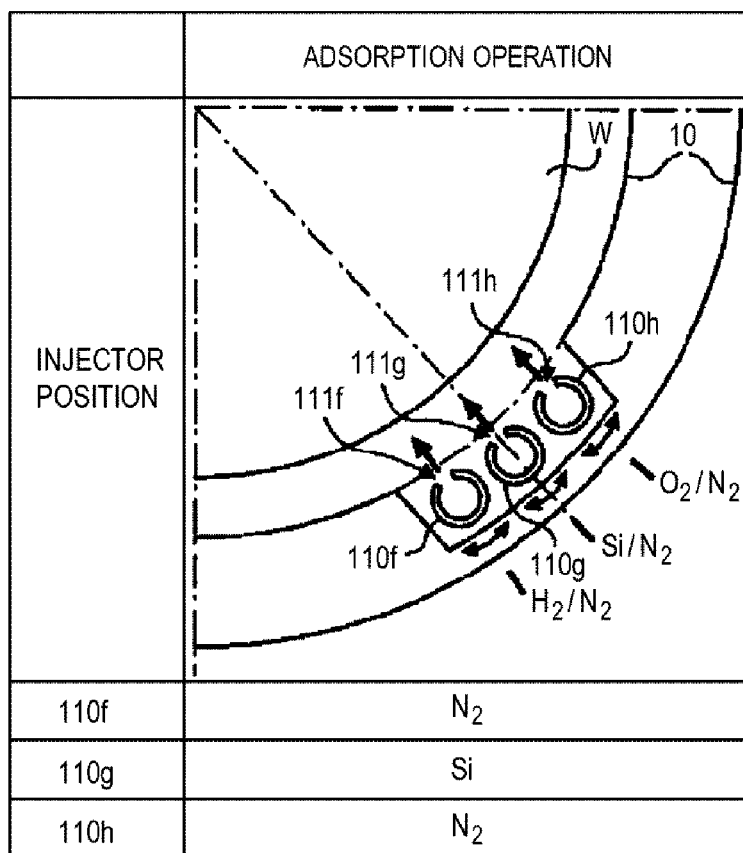
Figure 6B:
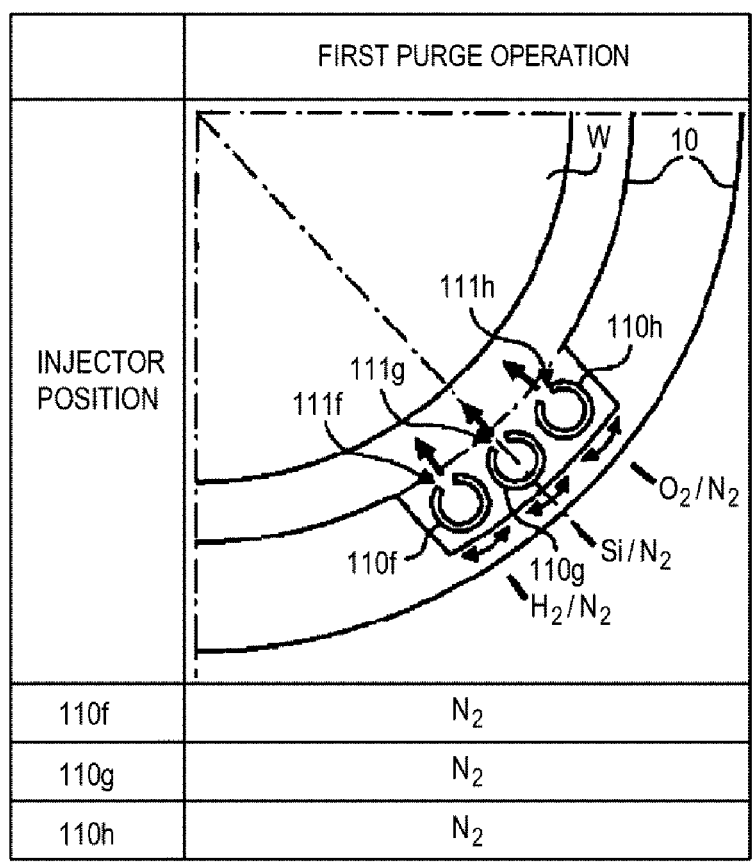
Figure 6C:
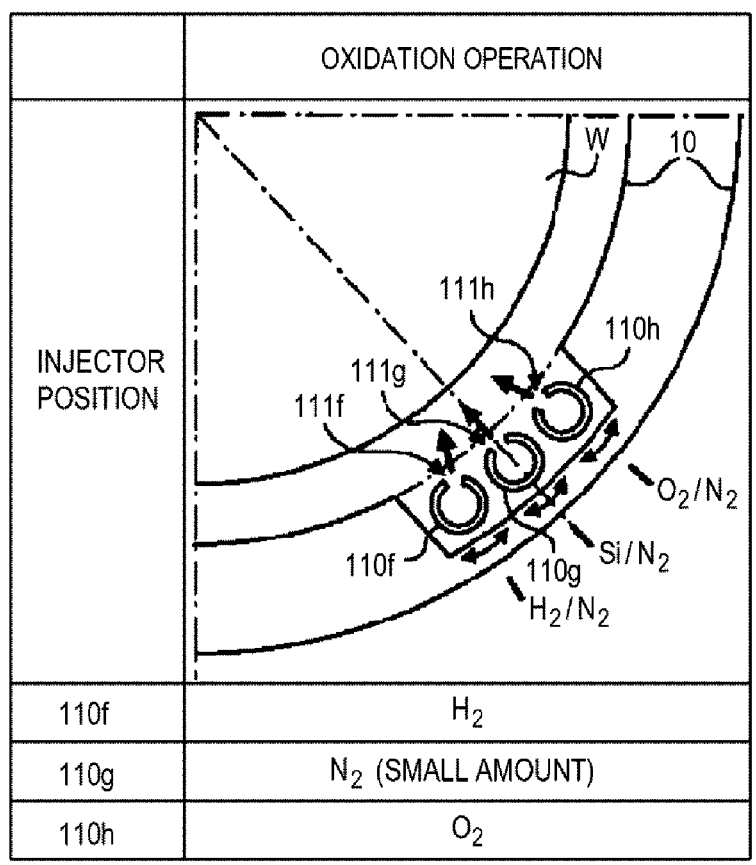
Figure 7A:
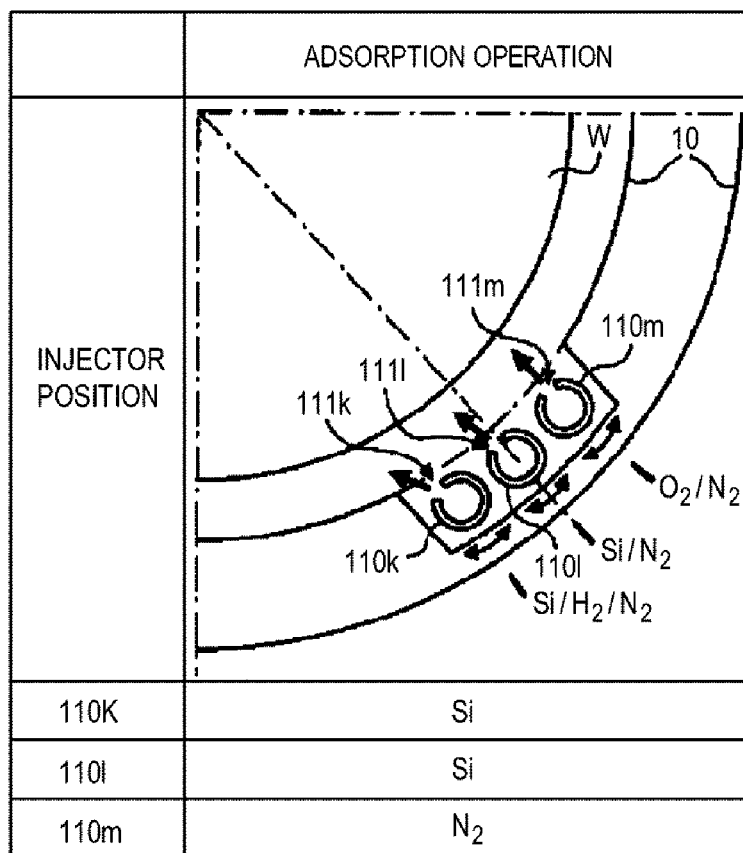
Figure 7D:
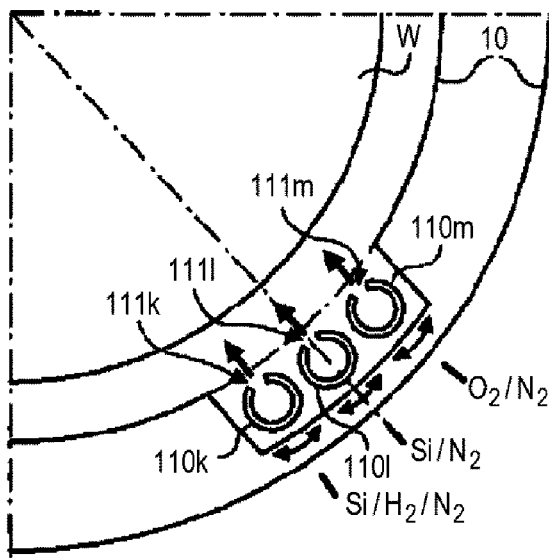

Next, the gas introduction mechanism of the substrate processing apparatus of FIG. 1 will be described. FIGS. 3A and 3B are views showing an example of the gas introduction mechanism of the substrate processing apparatus of FIG. 1. FIG. 4 is an exploded perspective view showing the internal structure of the gas introduction mechanism of FIGS. 3A and 3B.

As shown in FIGS. 3A, 3B and 4, the gas introduction mechanism includes a manifold 90, an injector 110, a rotation mechanism 200, and a gas pipe 121.

The manifold 90 includes an injector support portion 91 and a gas introduction portion 95.

The injector support portion 91 is a portion that extends in the vertical direction along an inner wall surface of the processing container 10 and supports the injector 110. The injector support portion 91 has an insertion hole 92 into which the lower end of the injector 110 can be inserted, wherein the lower end of the injector 110 can be fitted into the insertion hole 92 from outside to be supported by the insertion hole 92.

The gas introduction portion 95 is a portion that projects outwards in the radial direction from the injector support portion 91 and is exposed to the outside of the processing container 10. The gas introduction portion 95 has a gas flow passage 96 through which gas can flow while passing the insertion hole 92 and the outside of the processing container 10. A gas pipe 121 is connected to the outer end portion of the gas flow passage 96 so that gas from the outside can be supplied.

The injector 110 is inserted into the insertion hole 92 in the injector support portion 91, extends linearly as a whole along the inner wall surface of the processing container 10, and has an opening 112 that communicates with the gas flow passage 96 at a position where the injector 110 is inserted into the insertion hole 92. The opening 112 is formed into a substantially elliptical shape with, for example, a major axis in a horizontal direction and a minor axis in a vertical direction. Thus, even when the injector 110 rotates, gas is efficiently supplied from the gas flow passage 96 to the injector 110.

The manifold 90 is made of, for example, metal. From the viewpoint of preventing metal contamination, it is preferable that the processing container 10 and the parts constituting the processing container 10 be basically made of quartz. However, the manifold 90 has to be made of metal in the case where a shape is complicated or where it is threadedly connected with a screw or the like. The manifold 90 of the substrate processing apparatus according to the embodiment of the present disclosure is also made of metal, but the injector 110 is not formed into an L shape but a rod shape. With a configuration in which the gas flow passage 96, which extends horizontally, is formed in the gas introduction portion 95 of the manifold 90 and the opening 112 communicating with the gas flow passage 96 is formed in the injector 110, a thick horizontal portion of the injector 110 can be eliminated. Accordingly, the gas introduction portion 95 of the manifold 90 does not need to accommodate the thick horizontal portion of the injector 110, so the wall thickness of the gas introduction portion 95 of the manifold 90 is reduced and the height thereof is lowered to thereby reduce metal contamination. The metal constituting the manifold 90 may be a corrosion-resistant metal material such as stainless steel, aluminum, Hastelloy, or the like.

The rotation mechanism 200 is connected to the lower end portion of the injector 110, and rotates the injector 110 on its central axis extending in the longitudinal direction thereof. Specifically, the rotation mechanism 200 has an air cylinder 210 and a link mechanism 220, and converts linear motion (reciprocating motion) generated by the air cylinder 210 into rotational motion by the link mechanism 220 and transmits the rotational motion to the injector 110.

The air cylinder 210 has a cylinder portion 211, a rod portion 212, and a solenoid valve 213. A part of the rod portion 212 is accommodated in the cylinder portion 211. As air controlled by the solenoid valve 213 is supplied to the cylinder portion 211, the rod portion 212 reciprocates in the axial direction (lateral direction in FIGS. 3A and 3B) of the cylinder portion 211 and the rod portion 212. A hydraulic cylinder may be used in place of the air cylinder 210.

The link mechanism 220 has a link bar 221, a bellows 222, a retainer 223, a link portion 224, a washer 225, and a holding bolt 226.

The link bar 221 has a bar shape and is inserted into the manifold 90 in the state where airtightness is maintained by the bellows 222. One end of the link bar 221 is connected to the rod portion 212 of the air cylinder 210. Accordingly, as the rod portion 212 reciprocates in the axial direction of the cylinder portion 211 and the rod portion 212, the link bar 221 reciprocates together with the rod portion 212 in the axial direction of the cylinder portion 211 and the rod portion 212 (axial direction of the link bar 221). Instead of the bellows 222, a magnetic fluid seal may be used.

The retainer 223 is connected to the link bar 221 via the link portion 224. Accordingly, when the link bar 221 reciprocates in its axial direction, the retainer 223 rotates counterclockwise or clockwise (the direction indicated by the arrow in FIG. 3B). Specifically, as the link bar 221 moves in the right direction, the retainer 223 rotates counterclockwise, and as the link bar 221 moves in the left direction, the retainer 223 rotates clockwise. As shown in FIG. 4, an opening 223a is formed in the retainer 223. In the opening 223a, a stepped portion 223b is formed in the circumferential direction, so that the diameter of the opening gradually decreases from the upper surface side to the lower surface side of the retainer 223. A projection 223c is formed on the upper surface of the stepped portion 223b, and a recess, not shown, which is formed at the lower end portion of the injector 110, can be fitted with the projection 223c. Accordingly, the retainer 223 holds the injector 110 so that the injector 110 does not rotate in the circumferential direction relative to the retainer 223. When the retainer 223 rotates, the injector 110 rotates together with the retainer 223. Further, the retainer 223 is rotatably held by the holding bolt 226 via the washer 225.

The injector 110 may be configured to be rotatable by a rotation mechanism other than the above-described link mechanism 220. The injector 110 may be configured to be rotatable by a rotation mechanism having a motor and a worm gear mechanism, a rotation mechanism having an air cylinder and a rack and pinion mechanism, and a rotation mechanism having a motor and a rotational shaft.

[Substrate Processing Method]

Next, a substrate processing method using the above-described substrate processing apparatus will be described. The following substrate processing method is executed, for example, by the controller 150 controlling the operation of various devices in the substrate processing apparatus.

First Embodiment

In the first embodiment, an example of the case in which a silicon oxide film is formed by an atomic layer deposition (ALD) method using a substrate processing apparatus having three injectors rotatable around a rotational axis extending in the vertical direction and two fixed injectors will be described. FIGS. 5A to 5D are views showing a substrate processing method according to the first embodiment.

As shown in FIGS. 5A to 5D, the substrate processing apparatus has five injectors 110a, 110b, 110c, 110d, and 110e.

The injector 110a is provided so as to extend in the vertical direction inside the processing container 10. A nitrogen ($N_2$) gas supply source is connected to the injector 110a. A plurality of gas holes 111a is formed in the injector 110a at predetermined intervals in the longitudinal direction so that $N_2$ gas can be discharged from the gas holes 111a in the horizontal direction. The injector 110a is configured to be rotatable around a rotational axis extending in the vertical direction. When the injector 110a rotates, the supply direction of the $N_2$ gas supplied from the plurality of gas holes 111a is changed.

The injector 110b is disposed adjacent to the injector 110a and is provided so as to extend in the vertical direction inside the processing container 10. The injector 110b is connected to a hydrogen ($H_2$) gas supply source and an $N_2$ gas supply source. A plurality of gas holes 111b is formed in the injector 110b at predetermined intervals along the longitudinal direction so that $H_2$ gas and $N_2$ gas can be discharged from the gas holes 111b in the horizontal direction. The injector 110b is fixed such that the plurality of gas holes 111b face a predetermined direction (for example, toward the center of the processing container 10).

The injector 110c is disposed adjacent to the injector 110b and is provided so as to extend in the vertical direction inside the processing container 10. The injector 110c is connected to a silicon (Si)-containing gas supply source and an $N_2$ gas supply source, which are source gas. A plurality of gas holes 111c is formed in the injector 110c at predetermined intervals along the longitudinal direction so that Si-containing gas and $N_2$ gas can be discharged from the gas holes 111c in the horizontal direction. The injector 110c is configured to be rotatable around a rotational axis extending in the vertical direction. When the injector 110c rotates, the supply direction of the Si-containing gas and the $N_2$ gas supplied from the plurality of gas holes 111c is changed.

The injector 110d is disposed adjacent to the injector 110c and is provided so as to extend in the vertical direction inside the processing container 10. The injector 110d is connected to an oxygen ($O_2$) gas supply source and an $N_2$ gas supply source. A plurality of gas holes 111d is formed in the injector 110d at predetermined intervals along the longitudinal direction, so that $O_2$ gas and $N_2$ gas can be discharged from the gas holes 111d in the horizontal direction. The injector 110d is fixed such that the plurality of gas holes 111d faces a predetermined direction (for example, toward the center of the processing container 10).

The injector 110e is disposed adjacent to the injector 110d and is provided so as to extend in the vertical direction inside the processing container 10. The injector 110e is connected to an $N_2$ gas supply source. A plurality of gas holes 111e is formed in the injector 110e at predetermined intervals along the longitudinal direction so that $N_2$ gas can be discharged from the gas holes 111e in the horizontal direction. The injector 110e is configured to be rotatable around a rotational axis in the vertical direction. When the injector 110e rotates, the supply direction of the $N_2$ gas supplied from the plurality of gas holes 111e is changed.

In the substrate processing method according to the first embodiment, an adsorption operation, a first purge operation, an oxidation operation, and a second purge operation in this order are defined as one cycle, and this one cycle is repeated a predetermined number of times, thereby forming a silicon oxide film having a desired film thickness.

In the adsorption operation, the injectors 110a, 110c, and 110e are first rotated at a predetermined angle to change the direction in which gas is discharged from the gas holes 111a, 111c, and 111e. The predetermined angle is set, for example, according to a recipe. Subsequently, Si-containing gas is supplied from the injector 110c to adsorb the Si-containing gas on the wafer W. In addition, $N_2$ gas is supplied from the injectors 110a and 110e to control the adsorption range of the Si-containing gas. Further, $N_2$ gas having a flow rate lower than the flow rate in the first purging operation to be described later is supplied from the injectors 110b and 110d to prevent the Si-containing gas supplied from the injector 110c from being adsorbed in the injectors 110b and 110d. In the example of FIGS. 5A to 5D, the injectors 110a and 110e are rotated such that the gas holes 111a and 111e face the outside of the processing container 10 from the central direction thereof. Thereby, it is possible to suppress the infiltration of the Si-containing gas into the outer peripheral portion of the wafer W and to supply the Si-containing gas to the entire surface of the wafer W. Further, the injector 110c is rotated such that the gas holes 111c face a direction slightly shifted from a direction facing the center of the processing container 10 (hereinafter, referred to as "central direction"). The angles of the injectors 110a, 110c, and 110e are not limited thereto.

In the first purge operation, the injectors 110a, 110c, and 110e are first rotated at a predetermined angle to change the direction in which the gas is discharged from the gas holes 111a, 111c, and 111e. The predetermined angle is set, for example, according to a recipe. Subsequently, $N_2$ gas is supplied from the injectors 110a, 110b, 110c, 110d, and 110e to purge the Si-containing gas remaining in the processing container 10. In the example of FIGS. 5A to 5D, the angle of each of the injectors 110a and 110e is adjusted to be the same angle as the injectors 110a and 110e in the adsorption operation, and the angle of the injector 110c is changed such that the gas holes 111c face the central direction of the processing container 10. The angles of the injectors 110a, 110c, and 110e are not limited thereto.

In the oxidation operation, the injectors 110a, 110c, and 110e are first rotated at a predetermined angle to change the direction in which gas is discharged from the gas holes 111a, 111c, and 111e. The predetermined angle is set, for example, according to a recipe. Subsequently, $H_2$ gas is supplied from the injector 110b, and $O_2$ gas is supplied from the injector 110d. Thereby, a layer of silicon oxide ($SiO_2$) as a reaction product is formed by reacting the Si-containing gas adsorbed on the wafer W with an OH radical generated by the reaction of $H_2$ gas and $O_2$ gas. In addition, by supplying $N_2$ gas from the injectors 110a and 110e, the reaction range of the $O_2$ gas and the $H_2$ gas is controlled. Further, $N_2$ gas having a flow rate lower than the flow rate in the first purge operation is supplied from the injector 110c to prevent the formation of the layer of $SiO_2$ in the injector 110c. In the example of FIGS. 5A to 5D, the injectors 110a and 110e are rotated such that the gas holes 111a and 111e face outwardly from the central direction of the processing container 10. The rotation angles of the injectors 110a and 110e in the oxidation operation are controlled to be larger than the rotation angles of the injectors 110a and 110e, for example, in the adsorption operation. Thereby, it is possible to suppress the infiltration of the $H_2$ gas and the $O_2$ gas into the outer peripheral portion of the wafer W and to supply the $H_2$ gas and the $O_2$ gas to the entire surface of the wafer W. Further, the angle of the injector 110c is adjusted to be the same angle as the angle of the injector 110c in the first purge operation. The angles of the injectors 110a, 110c, and 110e are not limited thereto.

In the second purge operation, the injectors 110a, 110c, and 110e are first rotated at a predetermined angle to change the direction in which gas is discharged from the gas holes 111a, 111c, and 111e. The predetermined angle is set, for example, according to a recipe. Subsequently, $N_2$ gas is supplied from the injectors 110a, 110b, 110c, 110d, and 110e to purge the $H_2$ gas and the $O_2$ gas remaining in the processing container 10. In the example of FIGS. 5A to 5D, the angles of the injectors 110a, 110c, and 110e are adjusted to be the same angle as the injectors 110a, 110c, and 110e in the first purge operation. The angles of the injectors 110a, 110c, and 110e are not limited thereto.

As described above, in the substrate processing method according to the first embodiment, since the direction in which gas is discharged is changed according to the operations in the ALD method, it is possible to sufficiently control the in-plane distribution of the characteristics of the silicon oxide film formed on the wafer W.

In the example of FIGS. 5A to 5D, the case in which the supply direction of the processing gas is changed by rotating the injectors 110a, 110c, and 110e in accordance with the operations has been described as an example, but the injectors 110a, 110c, and 110e may be rotated during the operations.

Second Embodiment

In the second embodiment, another example of the case in which a silicon oxide film is formed by an ALD method using a substrate processing apparatus having three injectors rotatable around a rotational axis extending in the vertical direction will be described. FIGS. 6A to 6D are views showing a substrate processing method according to the second embodiment.

As shown in FIGS. 6A to 6D, the substrate processing apparatus has three injectors 110f, 110g, and 110h.

The injector 110f is provided so as to extend in the vertical direction inside the processing container 10. An $H_2$ gas supply source and an $N_2$ gas supply source are connected to the injector 110f. A plurality of gas holes 111f is formed in the injector 110f at predetermined intervals along the longitudinal direction so that $H_2$ gas and $N_2$ gas can be discharged from the gas holes 111f in the horizontal direction. The injector 110f is configured to be rotatable around a rotational axis extending in the vertical direction. When the injector 110f rotates, the directions in which $H_2$ gas and $N_2$ gas are supplied from the plurality of gas holes 111f are changed.

The injector 110g is disposed adjacent to the injector 110f and is provided so as to extend in the vertical direction inside the processing container 10. The injector 110g is connected to a Si-containing gas supply source and an $N_2$ gas supply source. A plurality of gas holes 111g is formed in the injector 110g at predetermined intervals along the longitudinal direction so that Si-containing gas and $N_2$ gas can be discharged from the gas holes 111g in the horizontal direction. The injector 110g is configured to be rotatable around a rotational axis extending in the vertical direction. When the injector 110g rotates, the supply direction of the Si-containing gas and the $N_2$ gas supplied from the plurality of gas holes 111g is changed.

The injector 110h is disposed adjacent to the injector 110g and is provided so as to extend in the vertical direction inside the processing container 10. The injector 110h is connected to an $O_2$ gas supply source and an $N_2$ gas supply source. A plurality of gas holes 111h is formed in the injector 110h at predetermined intervals along the longitudinal direction so that $O_2$ gas and $N_2$ gas can be discharged from the gas holes 111h in the horizontal direction. The injector 110h is configured to be rotatable around a rotational axis extending in the vertical direction. When the injector 110h rotates, the supply direction of the $O_2$ gas and the $N_2$ gas supplied from the plurality of gas holes 111h is changed.

In the substrate processing method according to the second embodiment, an adsorption operation, a first purge operation, an oxidation operation, and a second purge operation in this order are defined as one cycle, and this one cycle is repeated a predetermined number of times, thereby forming a silicon oxide film having a desired film thickness.

In the adsorption operation, the injectors 110f, 110g, and 110h are first rotated at a predetermined angle to change the direction in which gas is discharged from the gas holes 111f, 111g, and 111h. The predetermined angle is set, for example, according to a recipe. Subsequently, Si-containing gas is supplied from the injector 110g to adsorb the Si-containing gas on the wafer W. In addition, $N_2$ gas is supplied from the injectors 110f and 110h to control the adsorption range of the Si-containing gas. In the example of FIGS. 6A to 6D, the injectors 110f and 110h are rotated such that the gas holes 111f and 111h face outward from the central direction of the processing container 10. Thereby, it is possible to suppress the infiltration of the Si-containing gas into the outer peripheral portion of the wafer W, and to supply the Si-containing gas to the entire surface of the wafer W. Further, the injector 110g is rotated such that the gas holes 111g face the central direction of the processing container 10. The angles of the injectors 110f, 110g, and 110h are not limited thereto.

In the first purge operation, the injectors 110f, 110g, and 110h are first rotated at a predetermined angle to change the direction in which the gas is discharged from the gas holes 111f, 111g, and 111h. The predetermined angle is set, for example, according to a recipe. Subsequently, $N_2$ gas is supplied from the injectors 110f, 110g, and 110h to purge the Si-containing gas remaining in the processing container 10. In the example of FIGS. 6A to 6D, the angle of each of the injectors 110f and 110h is changed such that the gas holes 111f and 111h face the central direction of the processing container 10, and the angle of the injector 110g is adjusted to be the same angle as the injector 110g in the adsorption operation. The angles of the injectors 110f, 110g, and 110h are not limited thereto.

In the oxidation operation, the injectors 110f, 110g, and 110h are first rotated at a predetermined angle to change the direction in which the gas is discharged from the gas holes 111f, 111g, and 111h. The predetermined angle is set, for example, according to a recipe. Subsequently, $H_2$ gas is supplied from the injector 110f, and $O_2$ gas is supplied from the injector 110h, and thereby a layer of $SiO_2$ is formed by reacting the Si-containing gas adsorbed on the wafer W with an OH radical generated by the reaction of $H_2$ gas and $O_2$ gas. In addition, $N_2$ gas having a flow rate lower than the flow rate in the first purge operation is supplied from the injector 110g to prevent formation of the layer of $SiO_2$ in the injector 110g. In the example of FIGS. 6A to 6D, the injectors 110f and 110h are rotated such that the gas holes 111f and 111h face inward (direction facing each other) from the central direction of the processing container 10. Thereby, the reaction between the $H_2$ gas discharged from the gas hole 111f and the $O_2$ gas discharged from the gas hole 111h is promoted. The angle of the injector 110g is adjusted to be the same angle as the angle of the injector 110g in the first purge operation. Further, the angles of the injectors 110f, 110g, and 110h are not limited thereto.

In the second purge operation, the injectors 110f, 110g, and 110h are first rotated at a predetermined angle to change the direction in which gas is discharged from the gas holes 111f, 111g, and 111h. The predetermined angle is set, for example, according to a recipe. Subsequently, $N_2$ gas is supplied from the injectors 110f, 110g, and 110h to purge the $H_2$ gas and the $O_2$ gas remaining in the processing container 10. In the example of FIGS. 6A to 6D, the angles of the injectors 110f, 110g, and 110h are adjusted to be the same angle as the injectors 110f, 110g, and 110h in the adsorption operation. The angles of the injectors 110f, 110g, and 110h are not limited thereto.

As described above, in the substrate processing method according to the second embodiment, since the direction in which gas is discharged is changed according to the operations in the ALD method, it is possible to sufficiently control the in-plane distribution of the characteristics of the silicon oxide film formed on the wafer W.

In the example of FIGS. 6A to 6D, the case in which the supply direction of the processing gas is changed by rotating the injectors 110f, 110g, and 110h in accordance with the operations has been described by way of example, but the injectors 110f, 110g, and 110h may be rotated during the operations.

Third Embodiment

In the third embodiment, still another example of the case in which a silicon oxide film is formed by an ALD method using a substrate processing apparatus having three injectors rotatable around a rotational axis extending in the vertical direction will be described. FIGS. 7A to 7D are views showing a substrate processing method according to the third embodiment.

As shown in FIGS. 7A to 7D, the substrate processing apparatus has three injectors 110k, 110l, and 110m.

The injector 110k is provided so as to extend in the vertical direction inside the processing container 10. A Si-containing gas supply source, an $H_2$ gas supply source, and an $N_2$ gas supply source are connected to the injector 110k. A plurality of gas holes 111k is formed in the injector 110k at predetermined intervals along the longitudinal direction so that Si-containing gas, $H_2$ gas, and $N_2$ gas can be discharged from the gas holes 111k in the horizontal direction. The injector 110k is configured to be rotatable around a rotational axis extending in the vertical direction. When the injector 110k rotates, the supply directions of the Si-containing gas, the $H_2$ gas, and the $N_2$ gas supplied from the plurality of gas holes 111k are changed.

The injector 110l is disposed adjacent to the injector 110k and is provided so as to extend in the vertical direction inside the processing container 10. The injector 110l is connected to a Si-containing gas supply source and an $N_2$ gas supply source. A plurality of gas holes 111l is formed in the injector 110l at predetermined intervals along the longitudinal direction so that Si-containing gas and $N_2$ gas can be discharged from the gas holes 111l in the horizontal direction. The injector 110l is configured to be rotatable around a rotational axis extending in the vertical direction. When the injector 110l rotates, the supply direction of the Si-containing gas and the $N_2$ gas supplied from the plurality of gas holes 111l is changed.

The injector 110m is disposed adjacent to the injector 110l and is provided so as to extend in the vertical direction inside the processing container 10. The injector 110m is connected to an $O_2$ gas supply source and an $N_2$ gas supply source. A plurality of gas holes 111m is formed in the injector 110m at predetermined intervals along the longitudinal direction so that $O_2$ gas and $N_2$ gas can be discharged from the gas holes 111m in the horizontal direction. The injector 110m is configured to be rotatable around a rotational axis extending in the vertical direction. When the injector 110m rotates, the supply direction of the $O_2$ gas and the $N_2$ gas supplied from the plurality of gas holes 111m is changed.

In the substrate processing method according to the third embodiment, an adsorption operation, a first purge operation, an oxidation operation, and a second purge operation in this order are defined as one cycle, and this one cycle is repeated a predetermined number of times, and thereby a silicon oxide film having a desired film thickness is formed.

In the adsorption operation, the injectors 110k, 110l, and 110m are first rotated at a predetermined angle to change the direction in which gas is discharged from the gas holes 111k, 111l, and 111m. The predetermined angle is set, for example, according to a recipe. Subsequently, Si-containing gas is supplied from the injectors 110k and 110l to adsorb the Si-containing gas on the wafer W. In addition, $N_2$ gas is supplied from the injector 110m to control the adsorption range of the Si-containing gas. In the example of FIGS. 7A to 7D, the injectors 110k and 110l are rotated such that the gas holes 111k and 111l face a direction shifted from the central direction of the processing container 10, and the injector 110m is rotated such that the gas holes 111m face outward from the central direction of the processing container 10. Thereby, it is possible to suppress the infiltration of the Si-containing gas into the outer peripheral portion of the wafer W, and to supply the Si-containing gas to the entire surface of the wafer W. The angles of the injectors 110k, 110l, and 110m are not limited thereto.

In the first purge operation, the injectors 110k, 110l, and 110m are first rotated at a predetermined angle to change the direction in which the gas is discharged from the gas holes 111k, 111l, and 111m. The predetermined angle is set, for example, according to a recipe. Subsequently, $N_2$ gas is supplied from the injectors 110k, 110l, and 110m to purge the Si-containing gas remaining in the processing container 10. In the example of FIGS. 7A to 7D, the angle of each of the injectors 110k, 110l, and 110m is adjusted to be the same angle as the injectors 110k, 110l, and 110m in each reaction operation. The angles of the injectors 110k, 110l, and 110m are not limited thereto.

In the oxidation operation, the injectors 110k, 110l and 110m are first rotated at a predetermined angle to change the direction in which gas is discharged from the gas holes 111k, 111l, and 111m. The predetermined angle is set, for example, according to a recipe. Subsequently, $H_2$ gas is supplied from the injector 110k, and O₂ gas is supplied from the injector 110m, and thereby a layer of $SiO_2$ is formed by reacting the Si-containing gas adsorbed on the wafer W with an OH radical generated by the reaction of $H_2$ gas and $O_2$ gas. In addition, $N_2$ gas having a flow rate lower than the flow rate in the first purge operation is supplied from the injector 110l to prevent the formation of the layer of $SiO_2$ in the injector 110l. In the example of FIGS. 7A to 7D, the injectors 110k and 110m are rotated such that the gas holes 111k and 111m face inward from the central direction of the processing container 10. Thereby, the reaction between the $H_2$ gas discharged from the gas hole 111k and the $O_2$ gas discharged from the gas hole 111m is promoted. The angle of the injector 110l is adjusted such that the gas holes 111l face the central direction of the processing container 10. Further, the angles of the injectors 110k, 110l, and 110m are not limited thereto.

In the second purge operation, the injectors 110k, 110l, and 110m are first rotated at a predetermined angle to change the direction in which gas is discharged from the gas holes 111k, 111l, and 111m. The predetermined angle is set, for example, according to a recipe. Subsequently, $N_2$ gas is supplied from the injectors 110k, 110l, and 110m to purge the $H_2$ gas and the $O_2$ gas remaining in the processing container 10. In the example of FIGS. 7A to 7D, the angles of the injectors 110k and 110m are adjusted such that the gas holes 111k and 111m face slightly outwards from the central direction of the processing container 10. Further, the angle of the injector 110l is adjusted such that the gas holes 111l face the central direction of the processing container 10. The angles of the injectors 110k, 110l, and 110m are not limited thereto.

As described above, in the substrate processing method according to the third embodiment, since the direction in which gas is discharged is changed according to the operations in the ALD method, it is possible to sufficiently control the in-plane distribution of the characteristics of the silicon oxide film formed on the wafer W.

In particular, in the substrate processing method according to the third embodiment, since the angle of the injector 110 can be changed according to the operations, a plurality of kinds of gases (for example, adsorption gas and reaction gas) having different preferable supply directions can be supplied from the same injector 110. As a result, the number of injectors 110 can be reduced.

In addition, in the example of FIGS. 7A to 7D, the case in which the injectors 110k, 110l, and 110m are rotated to change the supply direction of the processing gas according to the operations has been described. However, the injectors 110k, 110l, and 110m may be rotated during the operations.

Fourth Embodiment

Figure 8:
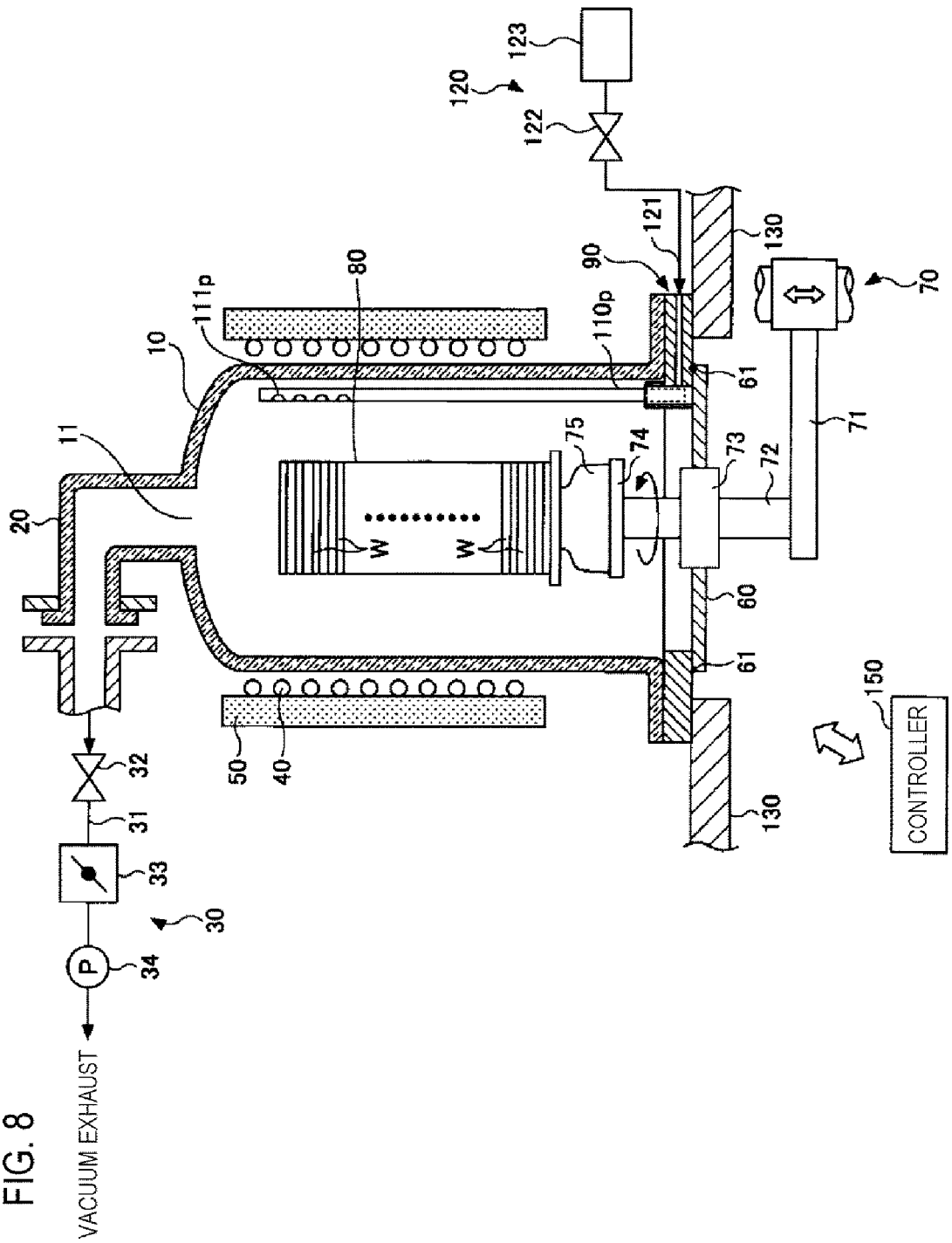
FIG. 8 is a view showing a substrate processing method according to a fourth embodiment.
Figure 9:
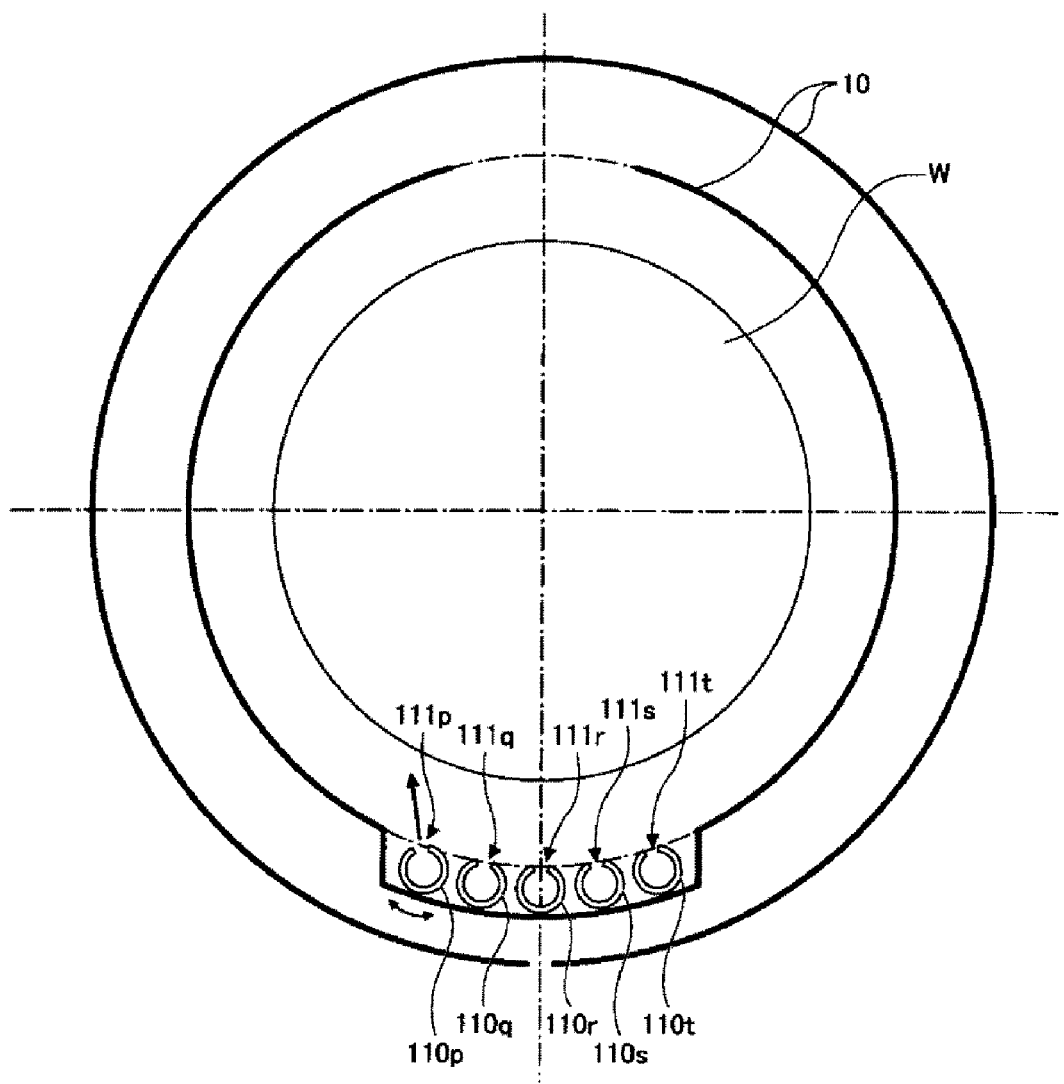
FIG. 9 is a view showing a substrate processing method according to a fourth embodiment.
Figure 10:
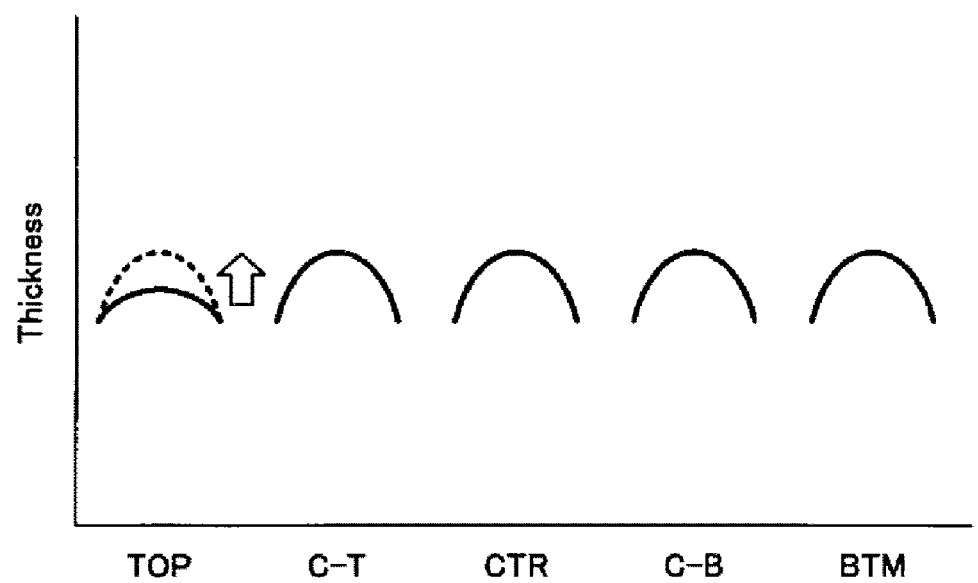
FIG. 10 is a view showing a substrate processing method according to a fourth embodiment.

The fourth embodiment exemplifies the case in which a predetermined film is formed on a wafer using a substrate processing apparatus which is rotatable around a rotational axis extending in the vertical direction and has an injector in which gas holes are formed only in the upper portion in the vertical direction. FIGS. 8 to 10 are views showing a substrate processing method according to the fourth embodiment. FIG. 8 shows an example of a substrate processing apparatus for carrying out the substrate processing method according to the fourth embodiment. FIG. 9 shows a transverse cross-section of FIG. 8, and FIG. 10 shows the effect of the substrate processing method according to the fourth embodiment. In FIG. 10, the abscissa indicates the position of the wafer held by the wafer boat 80, and the ordinate indicates the thickness of a film formed on the wafer W. In FIG. 10, "TOP", "CTR", and "BTM" represent the wafers W loaded on the upper, middle, and lower portions of the wafer boat 80, respectively. Further, "C-T" and "C-B" represent the wafers W loaded at positions between "CTR" and "TOP" and between "CTR" and "BTM", respectively.

As shown in FIG. 9, the substrate processing apparatus has one injector 110p that is rotatable around a rotational axis extending in the vertical direction and four fixed injectors 110q, 110r, 110s, and 110t.

The injector 110p is provided so as to extend in the vertical direction inside the processing container 10. A film-forming gas supply source, an $N_2$ gas supply source, and the like are connected to the injector 110p. A plurality of gas holes 111p is formed in the injector 110p at predetermined intervals along the longitudinal direction at an upper portion in the longitudinal direction (up-and-down direction) so that film-forming gas, $N_2$ gas, and the like can be discharged from the gas holes 111p in the horizontal direction. The injector 110p is configured to be rotatable around a rotational axis extending in the vertical direction. When the injector 110p rotates, the supply direction of the film-forming gas, the $N_2$ gas, and the like supplied from the plurality of gas holes 111p is changed.

The injectors 110q, 110r, 110s, and 110t are provided so as to extend in the vertical direction inside the processing container 10. A film-forming gas supply source, an $N_2$ gas supply source, and the like are connected to the injectors 110q, 110r, 110s, and 110t. A plurality of gas holes 111q, 111r, 111s, and 111t is formed in the injectors 110q, 110r, 110s, and 110t at predetermined intervals along the longitudinal direction. Then, film-forming gas, $N_2$ gas, and the like can be discharged from the gas holes 111q, 111r, 111s, and 111t in the horizontal direction. The injectors 110q, 110r, 110s and 110t are fixed such that the plurality of gas holes 111q, 111r, 111s and 111t face a predetermined direction (for example, the central direction of the processing container 10).

In the substrate processing method according to the fourth embodiment, the film-forming gas, the $N_2$ gas, and the like are supplied by the fixed injectors 110q, 110r, 110s, and 110t, and are supplied from the injector 110p, in the upper portion of which the plurality of gas holes 111p is formed in the vertical direction. At this time, by changing the rotation angle of the injector 110p, the in-plane distribution of the thickness of the film formed on the wafer W (indicated by "TOP" in the figure) held on the upper portion of the wafer boat 80 can be changed from the distribution indicated by the solid line in FIG. 10 to the distribution indicated by the broken line in FIG. 10.

In addition, in the examples of FIGS. 8 to 10, the case where the plurality of gas holes 111p is formed in the upper portion of the injector 110p, which is rotatable around a rotational axis extending in the vertical direction, has been described as an example, but the present disclosure is not limited thereto. For example, the plurality of gas holes 111p may be formed in the central portion and the lower portion of the injector 110p, which is rotatable around a rotational axis extending in the vertical direction. In these cases, it is possible to control the in-plane distribution of the thickness of the film formed on the wafer W held in the central portion and the lower portion of the wafer boat 80, respectively.

Advantageous Effects of the Invention

According to the disclosed substrate processing method, it is possible to control the in-plane distribution of the processing performed to the substrate.

The embodiments for carrying out the present disclosure have been described above, but the above contents do not limit the contents of the disclosure, and various modifications and improvements are possible within the scope of the present disclosure.

In each of the above embodiments, the case where a predetermined film is formed on the wafer W has been described as an example, but the present disclosure is not limited thereto. The present disclosure may be applicable even to a process in which a film formation operation of forming a predetermined film on the wafer W by supplying film-forming gas to the wafer W and an etching operation of etching a predetermined film by supplying etching gas for etching a predetermined film are repeated.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
supplying a processing gas from a plurality of gas holes formed along a longitudinal direction of a plurality of injectors, each of which extends in a vertical direction along an inner wall surface of a side wall of a processing container, to perform a predetermined process on a substrate accommodated in the processing container,
wherein the predetermined process includes a processing step of supplying the processing gas to the processing container to process the substrate,
wherein, in the processing step, at least one of the plurality of injectors supplies a raw material gas or a reaction gas that reacts with the raw material gas from outside of the substrate in a radial direction of the substrate toward the substrate, and a pair of injectors of the plurality of injectors is positioned with the at least one injector supplying the raw material gas or the reaction gas interposed therebetween and supplies an inert gas from the outside of the substrate in the radial direction of the substrate toward the substrate, and
wherein the pair of injectors supplying the inert gas is rotatable about a rotation axis extending in the vertical direction.

2. The substrate processing method of claim 1, wherein, in the processing step, a distribution range of the processing gas is controlled by rotating the pair of injectors supplying the inert gas.

3. The substrate processing method of claim 2, wherein the processing step comprises an adsorption step of supplying the processing gas containing the raw material gas to the processing container to adsorb the raw material gas on the substrate, and
wherein, in the adsorption step, an adsorption range of the raw material gas is controlled by rotating the pair of injectors supplying the inert gas.

4. The substrate processing method of claim 2, wherein the processing step comprises a reaction step of supplying the processing gas containing the reaction gas that reacts with the raw material gas to the processing container to form a layer of a reaction product, by reacting the adsorbed raw material gas with the reaction gas, and
wherein, in the reaction step, a reaction range of the reaction gas is controlled by rotating the pair of injectors supplying the inert gas.

5. The substrate processing method of claim 1, wherein, in the processing step, a direction in which the pair of injectors supplying the inert gas discharges the inert gas is a more outward direction with respect to a center of the processing container than a direction in which the at least one injector supplying the raw material gas or the reaction gas discharges the raw material gas or the reaction gas.

* * * * *